(12) United States Patent
Binowski et al.

(10) Patent No.: US 8,396,473 B2
(45) Date of Patent: Mar. 12, 2013

(54) INTELLIGENT SCANNING SYSTEM AND METHOD FOR WALKIE-TALKIE DEVICES

(75) Inventors: Gary Binowski, Conyers, GA (US);
Edwin Booth, Brooklyn, NY (US); John H. Du Hart, IV, South Setauket, NY (US); Michael Faith, Coram, NY (US); Michael N. Hagans, Medina, OH (US); Edward Moskaluk, Copley, OH (US); Stephen F. Paulus, Tallmadge, OH (US); Kelly Schlueter, Wadsworth, OH (US)

(73) Assignee: Symbol Technologies, Inc., Holtsville, NY (US)

( * ) Notice: Subject to any disclaimer, the term of this patent is extended or adjusted under 35 U.S.C. 154(b) by 771 days.

(21) Appl. No.: 11/687,442

(22) Filed: Mar. 16, 2007

(65) Prior Publication Data

US 2008/0227412 A1      Sep. 18, 2008

(51) Int. Cl.
*H04W 4/00* (2009.01)
(52) U.S. Cl. .................. 455/434; 455/161.2; 455/166.2; 455/3.02
(58) Field of Classification Search ............... 455/161.2, 455/3.02, 166.2, 514, 3.04, 3.01, 3.06, 45, 455/186.1, 434, 512, 179.1, 185.1
See application file for complete search history.

(56) References Cited

U.S. PATENT DOCUMENTS

| 3,617,895 | A | 11/1971 | Tomsa et al. |
| 4,123,717 | A | 10/1978 | Yiu et al. |
| 4,498,194 | A | 2/1985 | Vandegraaf |
| 4,716,407 | A | 12/1987 | Borras et al. |
| 5,257,416 | A | 10/1993 | Cannon |
| 5,697,077 | A * | 12/1997 | Saitoh ........................ 455/186.1 |
| 5,806,002 | A * | 9/1998 | Wiatrowski et al. .......... 455/512 |
| 5,956,648 | A * | 9/1999 | Brennan et al. ............... 455/518 |
| 6,023,230 | A * | 2/2000 | Dorenbosch et al. ........ 340/7.24 |
| 6,449,491 | B1 * | 9/2002 | Dailey .......................... 455/518 |
| 6,745,043 | B1 * | 6/2004 | Lester et al. .................. 455/512 |
| 6,810,251 | B2 * | 10/2004 | Hassan et al. ................. 455/434 |
| 2003/0040293 | A1 * | 2/2003 | Fish et al. .................. 455/186.1 |
| 2003/0222765 | A1 * | 12/2003 | Curbow et al. ............ 340/309.7 |
| 2004/0110122 | A1 * | 6/2004 | Kasinrerk ......................... 435/4 |
| 2005/0191958 | A1 * | 9/2005 | Hoskins ...................... 455/3.01 |
| 2005/0202788 | A1 * | 9/2005 | Vinson et al. ................ 455/90.3 |
| 2005/0208913 | A1 * | 9/2005 | Raisinghani et al. ....... 455/161.2 |
| 2008/0013600 | A1 * | 1/2008 | Fudally ......................... 375/136 |
| 2008/0066111 | A1 * | 3/2008 | Ellis et al. ...................... 725/57 |
| 2008/0075035 | A1 * | 3/2008 | Eichenberger ................ 370/328 |

OTHER PUBLICATIONS

International Preliminary Report on Patentability and the Written Opinion of the International Searching Authority for PCT/US2008/055412 mailed Sep. 22, 2009.
EPC Examination Report Dated Mar. 2, 2011 for Foreign Counterpart.

* cited by examiner

*Primary Examiner* — Sujatha Sharma
(74) *Attorney, Agent, or Firm* — Wang Su; Nongqiang Fan; Daniel R. Bestor

(57) ABSTRACT

A method and system for scanning channels in a network for incoming audio transmissions. A device enters an intelligent scanning mode, which initiates an automatic scanning of predefined channels for incoming audio transmissions. Upon detection, the device tunes to the channel of the incoming audio transmission while continually searching channels of a higher priority for incoming audio transmissions of a higher priority. A device enters a single channel mode to send an outgoing transmission, which automatically reverts the device to the channel of the last incoming audio transmission.

20 Claims, 5 Drawing Sheets

INTELLIGENT SCANNING SYSTEM AND METHOD FOR WALKIE-TALKIE DEVICES

FIELD OF THE INVENTION

The present invention relates an intelligent scanning system and method for walkie-talkie devices.

BACKGROUND

A wireless mobile device with walkie-talkie functionality uses a half-duplex multicast system where one user may transmit an audio transmission across a certain channel to any plurality of recipients. This half-duplex transmission is transmitted over a Voice over Internet Protocol (VOIP) network, where voice conversations are routed to their destination over the internet via any series of routers and servers. In the half-duplex transmission, only one user may transmit an audio signal across a channel at any given time. Any plurality of recipients that are tuned into this channel may receive the audio transmission.

Typical walkie-talkie mobile devices require users to manually scroll through a list of channels to search for incoming transmissions. Once an audio signal is multicast over a channel, only those users that are already tuned into that channel may receive the audio transmission. Furthermore, if a user wishes to reply to a received audio transmission across a particular channel, the user must manually select the channel in question and then send the outgoing audio transmission.

SUMMARY OF THE INVENTION

Accordingly, the exemplary embodiments of the present invention are directed to advantageously provide, on a device with a half-duplex communication ability (e.g., any device with a walkie-talkie feature), an approach to streamline the process of sending and receiving multicast transmissions through the use of an intelligent scanning system.

An Intelligent Scan Mode may be selectively triggered on a half-duplex device so as to allow the half-duplex device to scan a predefined list of channels for incoming audio transmissions. A user of the half-duplex device may then be notified of all incoming audio transmissions and prompted to select a channel to tune to. The incoming audio transmissions may be recorded so the user may hear the selected audio transmission in its entirety. Alternatively, a Single Channel Mode may be selectively triggered on a half-duplex device to allow the user of said half-duplex device to manually select a channel.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DETAILED DESCRIPTION

In the exemplary embodiments, a method and system is described for facilitating the use of half-duplex devices. Although the exemplary embodiments are described using a walkie-talkie as an example of a half-duplex communication device, the present invention is applicable to any communication device that has a half-duplex communication ability (e.g., a cell phone, a personal digital assistant, a two-way radio, a data acquisition device, etc.). Moreover, although the exemplary embodiments are described using mobile devices as exhibiting a half-duplex capability, the present invention applies as well to stationary half-duplex devices. Further, the exemplary embodiments of the present invention may also be used in VOIP half-duplex devices.

In the exemplary embodiments, a user-friendly interface is used, which allows mobile device users the option to automatically listen to incoming audio transmissions across any predetermined list of channels, regardless of the channel the mobile device is currently tuned to, via use of an Intelligent Scan Mode. Furthermore, when placing an outgoing transmission, the mobile device may utilize the callback feature to automatically revert to the last channel that was heard, via use of the Single Channel Mode. As will be described more fully below, the present invention provides a system and method by which a mobile device may activate and utilize the aforementioned Intelligent Scan Mode and Single Channel Mode.

The present invention may be further understood with reference to the following description and the appended drawings. An exemplary embodiment of the present invention describes a system including a plurality of mobile devices involved in a half-duplex communication transmission.

Figure 1:
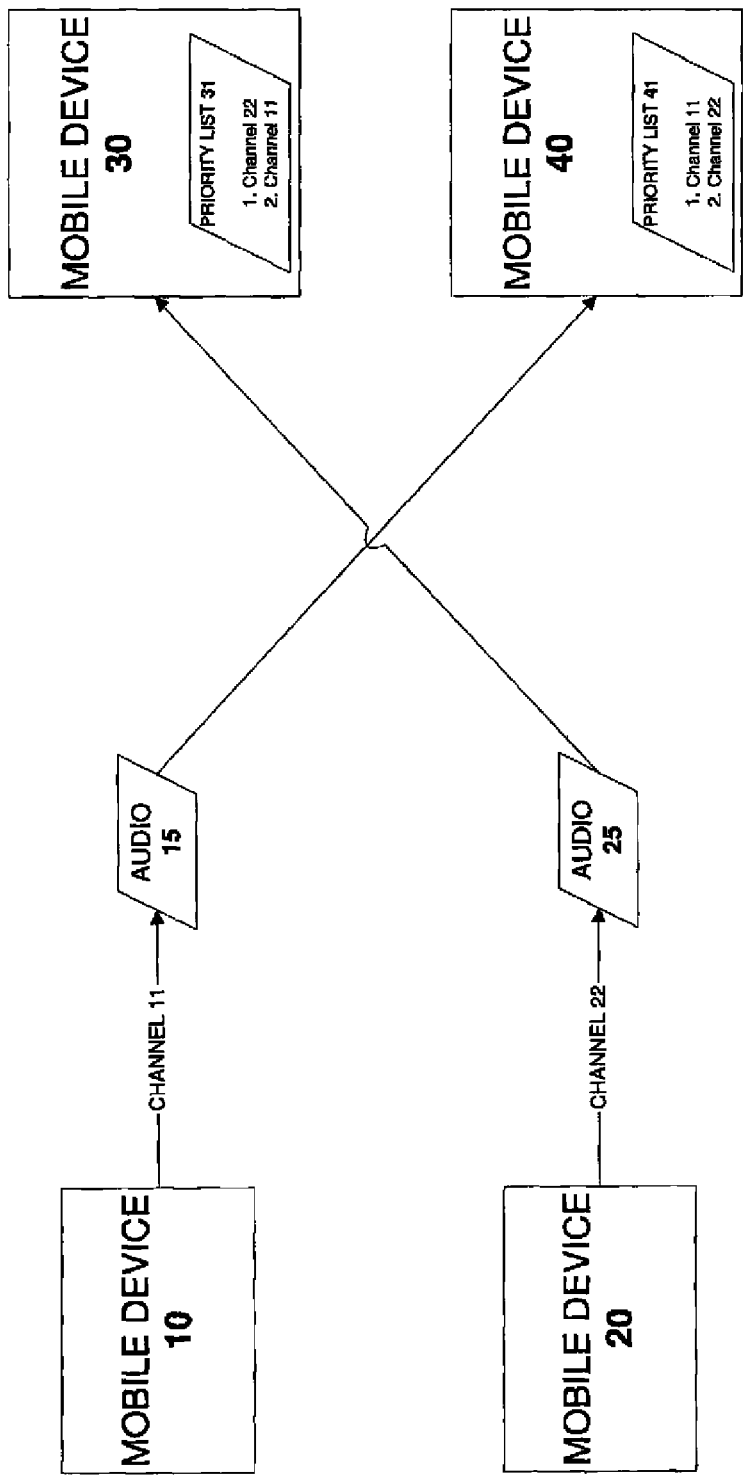
FIG. 1 shows a first exemplary system for employment of intelligent scanning according to an exemplary embodiment of the present invention.

FIG. 1 shows a first system according to an exemplary embodiment of the present invention. Mobile devices 30 and 40 are each equipped with a processor and a memory. Initially, the mobile device 30 and the mobile device 40 are both in Intelligent Scan Mode. Accordingly, both the mobile device 30 and the mobile device 40 have corresponding priority lists, priority list 31 and priority list 41, respectively. The priority lists are lists of channels that serve to define the channel preferences for each mobile device, as detailed below.

When a mobile device, such as mobile device 10 or mobile device 20, is in Intelligent Scan Mode, the mobile device may scan a list of channels for incoming audio transmissions. This list may include any combination of channels, which may be pre-programmed by the user of the mobile device. Additionally, the user of the mobile device may assign priorities to each of the aforementioned channels. Therefore, when the mobile device enters Intelligent Scan Mode, the mobile device may scan the channels in order of priority, working down from higher priority channels until an audio transmission is detected on a channel. Once the audio transmission is received from a particular channel, the mobile device may tune to that channel. After tuning to this channel, the mobile device may continue searching channels of a higher priority for other incoming transmissions. If no other incoming transmission is received on the higher priority channels, the device continues to search. If an audio transmission is received on a higher priority channel, the mobile device may switch to that channel.

As shown in FIG. 1, the mobile device 30 gives first priority to channel 22 and second priority to channel 11. Conversely, the mobile device 40 gives first priority to channel 11 and second priority to channel 22. Those skilled in the art will understand that the number of channels within any given priority list may vary according to user preferences, memory capability of the mobile device, channel availability within a network, etc.

Both the mobile device 30 and the mobile device 40 continually scan the channels in the scope of their priority lists 31 and 41 for incoming audio transmissions. In the exemplary embodiment shown, the mobile device 10 and the mobile device 20 simultaneously transmit audio signals 15 and 25 across channels 11 and 22, respectively. The mobile device 30, being in Intelligent Scan Mode, may detect that audio transmissions have been made on the channel 11 and the channel 22. Since the channel 22 is of a higher priority than the channel 11, this higher priority for channel 22 allows only the audio transmission 25 to be received by the mobile device 30. The mobile device 30 is automatically tuned to the channel 22 so that the incoming audio transmission 25 may be heard.

Similarly, the mobile device 40 may detect the two audio transmissions 15 and 25. Because channel 11 is of a higher priority for mobile device 40, only the audio transmission 15 is received at the mobile device 40. The mobile device 40 is automatically tuned to the channel 11 so that the incoming audio transmission 15 may be heard. Those skilled in the art will understand that the audio signals 15 and 25 may be multicast to any plurality of recipients that allow the corresponding channels 11 and 22 preference in their priority lists.

Figure 2:
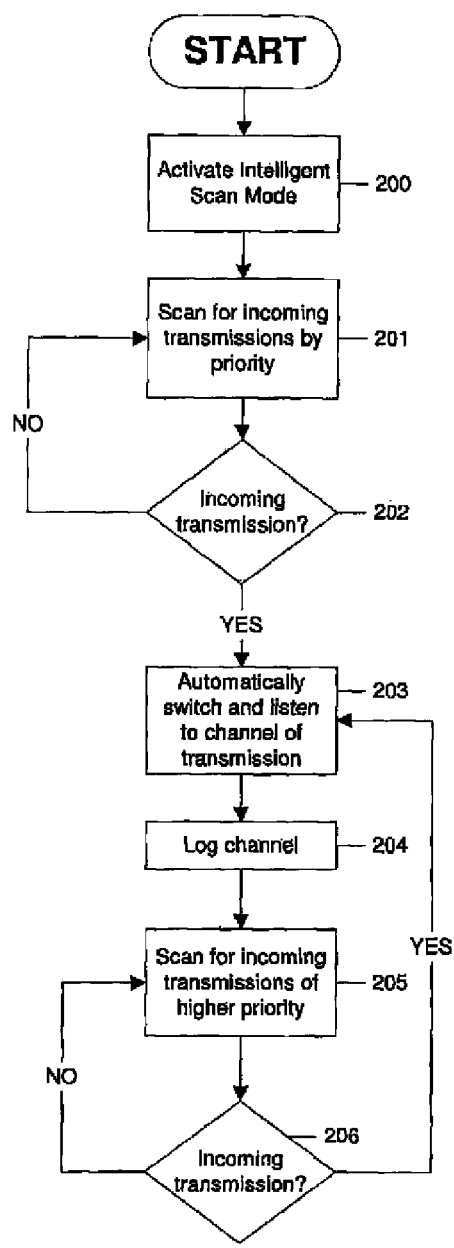
FIG. 2 shows a first exemplary method for the first system of FIG. 1.

FIG. 2 shows a first exemplary method of the first system of FIG. 1. The method of FIG. 2 will be described with reference to the system of FIG. 1. In step 200, the mobile device 30 may activate Intelligent Scan Mode. The activation of the Intelligent Scan Mode on the mobile device 30 may be in various manners. For example, a user interface of the mobile device 30 may include an Intelligent Scan Mode selection button (hard or soft key). Alternatively, the mobile device 30 may have a menu option to enable activation of the Intelligent Scan Mode. Once the mobile device 30 enters Intelligent Scan Mode, the mobile device 30 may automatically scan through the channels in the priority list 31 in descending order, as described earlier.

In step 201, the mobile device 30 may scan from channels of higher priority to channels of lower priority, until an audio transmission is detected. In the case of devices communicating via VOIP walkie-talkie transmissions, detection of an audio transmission may be done, for example, via performing a check for the presence of a multicast VOIP stream from a walkie-talkie stream originator at that particular time, as those skilled in the art will understand. Each scan will check for incoming transmissions (step 202). If there is no incoming transmission, the method will loop back to step 201 and sequentially scan channels of a lower priority. As long as the mobile device is in Intelligent Scan Mode, the mobile device 30 may continuously scan all channels within its priority list until a transmission is received.

If, in step 202, an incoming transmission is detected, the mobile device 30 may automatically tune to said channel in order to enable the user of the mobile device 30 to be able to listen to the audio transmission (step 203). The mobile device 30 then registers the channel of the incoming audio transmission in step 204. This register may be referenced at a latter point in the method, so that the mobile device 30 may respond to the last channel 22 the audio transmission 25 was received from, as described with respect o FIG. 4. After the mobile device 30 tunes to the channel of the incoming audio transmission, the mobile device 30 continues to scan channels of a higher priority for other incoming transmissions (step 205).

If in step 206, it is determined that there are no other audio transmissions from channels of higher priority, the process loops back to step 205 so that the mobile device 30 may continue to scan for other incoming audio signals. If, in step 206, an audio transmission is detected from a channel of a higher priority, the mobile device 30 may automatically switch to the higher priority channel and loop the method back to step 203.

Figure 4:
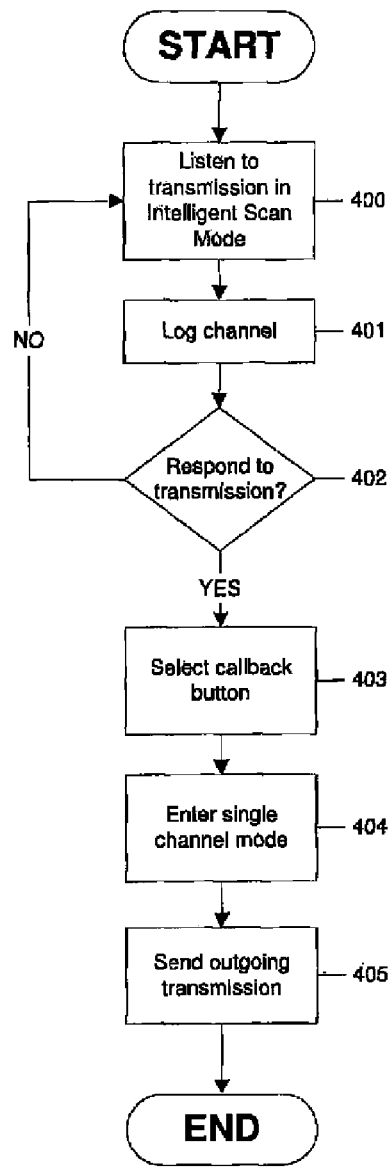
FIG. 4 shows a first method for transitioning from intelligent scanning mode to single channel mode according to the exemplary embodiment of the present invention.

Those skilled in the art will understand that the mobile device 30 may not necessarily automatically switch to a higher priority channel in step 206. If a higher priority channel is detected, mobile device 30 may automatically switch channels, never switch channels, only switch for certain channels, or prompt before switching channels (as shown in FIG. 4), as those of skill in the art will understand.

Accordingly, the process may loop from step 206 to step 205 or 203 until mobile device 30 switches out of Intelligent Scan Mode. The mobile device 30 may use a hard or soft key to switch out of Intelligent Scan Mode and return to a normal non-active mode. The mobile device 30 may also exit Intelligent Scan Mode by entering into Single Channel Mode, as will be described below in reference to FIG. 4.

Figure 3:
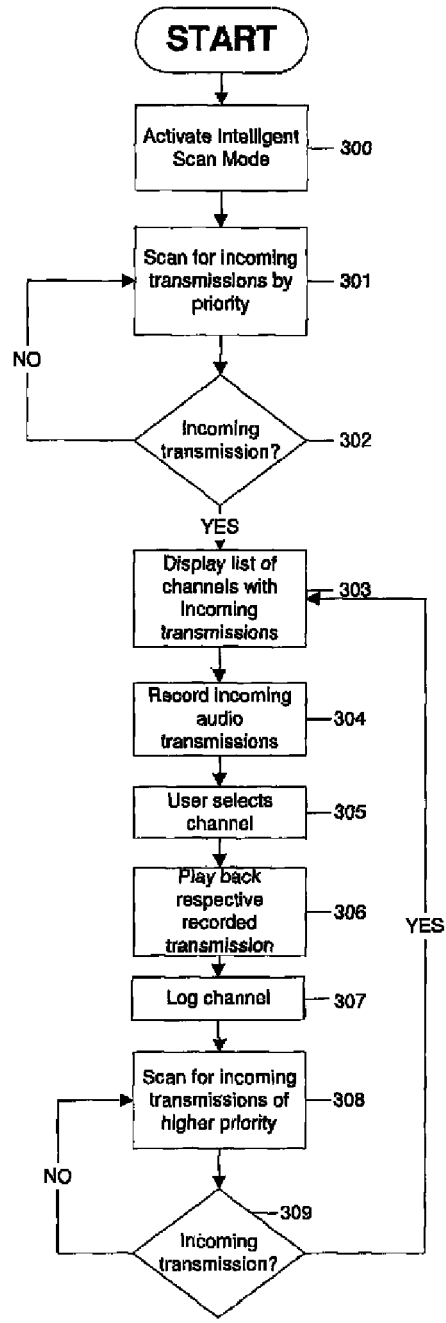
FIG. 3 shows a second exemplary method for the first system of FIG. 1.

FIG. 3 shows a second exemplary method of the first system of FIG. 1. The method of FIG. 3 will be described with reference to the system of FIG. 1. In step 300, the mobile device 30 enters Intelligent Scan Mode using the same methods as noted earlier. Once in Intelligent Scan Mode, the mobile device 30 scans for incoming audio transmissions by priority (step 301). In step 302, if no incoming audio transmission is detected, the method loops back to step 301 to continue to search for incoming audio transmissions. If an incoming audio transmission is detected, the mobile device 30 may display the list of channels with incoming transmissions in step 303. The mobile device may also notify the user of the other incoming audio transmission via an audio notification (i.e., a beep, a ring, etc.), a display message on the mobile device 30 or a combination of both. By notifying the user of the mobile device 30 of the other incoming audio transmission(s), the user of the mobile device 30 may decide whether or not to switch to the higher priority audio transmission.

The mobile device 30 may now record the incoming audio transmission(s) so the user of the mobile device 30 may listen to the incoming audio transmission(s) in their entirety (step 304). This recording may involve the recording of incoming audio transmissions that are sent on channels having a priority higher than the one to which the mobile device 30 is currently tuned. Those skilled in the art will understand that the time delay caused by the prompted request of the user of the mobile device 30 may prevent the user from being able to listen to the entire audio signal in real time. As such, the mobile device 30 may be equipped with the appropriate memory (e.g., flash memory, EEPROM, SRAM, etc.) to temporarily or permanently record and retain in its volatile or non-volatile memory the last few incoming audio transmissions from the priority list of the mobile device 30. Accordingly, when the user of the mobile device 30 selects a channel from the priority list, the audio transmission held in the memory of the mobile device may be played back. Those skilled in the art will understand that the length, quality and capacity of the aforementioned recordings may be dependent upon a number of factors including available memory on the mobile device, user-defined settings, etc.

In step 305, the user of the mobile device 30 may decide which channel to listen to and the mobile device 30 may tune to said channel. In step 306, the recorded audio transmission for the channel in question is played back. Those skilled in the art will understand that, if the user of the mobile device 30 tunes to said channel while the audio signal is still being transmitted, the recording may play from the beginning but will continue to record until the transmission is complete. The mobile device 30 may then log the channel of the incoming audio transmission in step 307. After the mobile device 30 tunes to the channel of the incoming audio transmission, the mobile device 30 may continue to scan channels of a higher priority for other incoming transmissions (step 308). If in step 309, it is determined that there are no other audio transmissions from channels of higher priority, the process loops back to step 308 so that the mobile device 30 may continue to scan for incoming audio signals. If, in step 309, an audio transmission is detected from a channel of a higher priority, the mobile device 30 loops back to step 303 and again displays the list of channels with incoming audio transmissions. Accordingly, the process may loop from step 309 to step 308 or 303 until mobile device 30 switches out of Intelligent Scan Mode.

FIG. 4 shows a first method for transitioning from intelligent scanning mode to single channel mode according to the exemplary embodiment of the present invention. The method of FIG. 4 will be described with reference to the system of FIG. 1. Initially, in step 400 the mobile device 30 is listening to an incoming audio transmission in Intelligent Scan Mode. In step 401, the mobile device 30 logs the channel of the last incoming transmission. The user of the mobile device 30 must decide if a response to the incoming transmission may be sent in step 402. If the user of the mobile device 30 chooses not to respond in step 402, the mobile device 30 may continue listening to the incoming audio transmission(s) in Intelligent Scan Mode by looping back to step 400. It is to be understood that at any point in this method, if the mobile device 30 is listening to an audio transmission, it is inferred that the mobile device is also scanning for signals from channels of a higher priority, as described with respect to FIGS. 1 and 2.

If, in step 402, the user of the mobile device 30 decides to respond to the incoming audio transmission, the process will move forward to step 403. In step 403, the user of the mobile device 30 may select a callback button (hard or soft key). The callback button used herein may be a push-to-talk button generally used to initiate walkie-talkie transmissions on mobile devices or it may be a separate dedicated callback button, as those skilled in the art will understand. Additionally, those skilled in the art will understand that an outgoing audio transmission may only be initiated if the respective channel is currently available. In step 404, the mobile device 30 may exit Intelligent Scan Mode and enter Single Channel Mode. By entering Single Channel Mode, the mobile device 30 may revert back automatically to the channel of the last incoming audio transmission. The mobile device 30 may now send an outgoing audio transmission without having to manually tune to the channel of the last incoming audio transmission. In step 405, the outgoing audio transmission is sent and the process is then ended.

Entering Single Channel Mode may automatically revert back to the channel of the last incoming audio transmission, regardless of whether the mobile device 30 switches from Intelligent Scan Mode or from a normal non-active mode.

Figure 5:
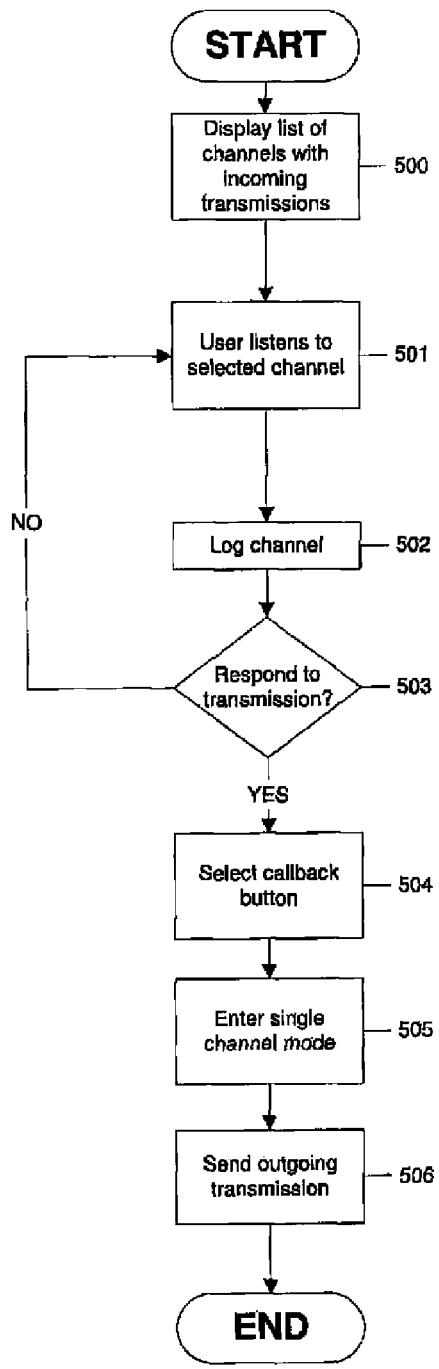
FIG. 5 shows a second method for transitioning from intelligent scanning mode to single channel mode according to the exemplary embodiment of the present invention.

FIG. 5 shows a second method for transitioning from Intelligent Scanning Mode to Single Channel Mode. The method of FIG. 5 will be described with reference to the system of FIG. 1 and in correlation with the method of FIG. 3. Initially, in step 500 the mobile device 30 displays a list of incoming audio transmissions. In step 501, the user of the mobile device 30 may select a channel to listen to and the mobile device 30 may tune to that channel and play back the message in its memory.

In step 502, the mobile device 30 may log the channel of the last incoming transmission. The user of the mobile device 30 may then decide if a response to the incoming transmission may be sent in step 503. If the user of the mobile device 30 chooses not to respond in step 503, the mobile device 30 may continue listening to the incoming audio transmission(s) in Intelligent Scan Mode by looping back to step 501.

If, in step 503, the user of the mobile device 30 decides to respond to the incoming audio transmission, the process will move forward to step 504. In step 504, the user of the mobile device 30 may select the callback button (hard or soft key). In step 505, the mobile device 30 may exit Intelligent Scan Mode and enter Single Channel Mode. By entering Single Channel Mode, the mobile device 30 may revert back to the channel of the last incoming audio transmission. The mobile device 30 may now send an outgoing audio transmission without having to manually tune to the channel of the last incoming transmission. In step 506, the outgoing audio transmission is sent and the process is then ended.

Those skilled in the art will understand that the described exemplary embodiments of the present invention may be altered without departing from the spirit or scope of the invention. Thus, it is to be understood that these embodiments have been described in an exemplary manner and are not intended to limit the scope of the invention which is intended to cover all modifications and variations of this invention that come within the scope of the appended claims and their equivalents.

What is claimed is:

1. A method in a communications device for scanning for audio transmissions, comprising:
   generating by the communications device a priority list of channels to coordinate the order of scanning of channels;
   tuning by the communications device to a currently active highest priority channel out of the priority list of channels that currently has an incoming audio transmission;
   while tuned to the currently active highest priority channel and playing back the incoming audio transmission:
      continually scanning by the communications device remaining channels from the priority list of channels having a priority higher than the currently active highest priority channel for new incoming audio transmissions; and
      if a new incoming audio transmission is detected on a particular one of the remaining channels, providing a notification of the detection of the new incoming audio transmission on the particular one of the remaining channels; and
   responsive to receiving a corresponding user input, switching to the particular one of the remaining channels and playing back the new incoming audio transmission.

2. The method according to claim 1,
   wherein the notification includes a plurality of particular ones of the remaining channels, each of the plurality of particular ones of the remaining channels having a corresponding new incoming audio transmission detected thereon, and each of the plurality of particular ones of the remaining channels having a priority higher than the currently active highest priority channel.

3. The method according to claim 2, wherein the corresponding user input comprises a selection of one of the plurality of particular ones of the remaining channels.

4. The method according to claim 2, further comprising:
while tuned to the currently active highest priority channel, recording at least one of the corresponding new incoming audio transmissions sent over one of the plurality of particular ones of the remaining channels.

5. The method according to claim 1, further comprising:
while tuned to the currently active highest priority channel, recording at least one new incoming audio transmission detected on a particular remaining channel out of the priority list of channels having a priority higher than the currently active highest priority channel.

6. The method according to claim 5, further comprising:
responsive to receiving the user input, switching to the particular remaining channel, and while continuing to record any subsequently received portions of the new incoming audio transmission, playing back already recorded portions of the new incoming audio transmission.

7. The method according to claim 5, further comprising:
while tuned to the currently active highest priority channel, recording a plurality of new incoming audio transmissions, each new incoming audio transmission detected on a corresponding particular one of the remaining channels having a priority higher than the currently active highest priority channel.

8. The method according to claim 1, further comprising:
logging a last channel out of the list of channels on which a last incoming audio transmission was detected.

9. The method according to claim 8, further comprising:
responsive to a user input indicating an intent to transmit a response to the last incoming audio transmission, automatically tuning to the logged last channel.

10. A telecommunications device, comprising:
a memory for storing a priority list of channels; and
a processor configured to:
tune to a currently active highest priority channel out of the priority list of channels that currently has an incoming audio transmission,
while tuned to the currently active highest priority channel and playing back the incoming audio transmission:
continually scan remaining channels from the priority list of channels having a priority higher than the currently active highest priority channel for new incoming audio transmissions, and
if a new incoming audio transmission is detected on a particular one of the remaining channels, providing a notification of the detection of the new incoming audio transmission on the particular one of the remaining channels; and
responsive to receiving a corresponding user input, switching to the particular one of the remaining channels and playing back the new incoming audio transmission.

11. The device according to claim 10, wherein the notification includes a plurality of particular ones of the remaining channels, each of the plurality of particular ones of the remaining channels having a corresponding new incoming audio transmission detected thereon, and each of the plurality of particular ones of the remaining channels having a priority higher than the currently active highest priority channel.

12. The device according to claim 11, wherein the corresponding user input comprises a selection of one of the plurality of particular ones of the remaining channels.

13. The device according to claim 11, wherein the processor is configured to:
while tuned to the currently active highest priority channel, store in the memory at least one of the corresponding new incoming audio transmissions sent over one of the plurality of particular ones of the remaining channels.

14. The device according to claim 10, wherein the processor is configured to:
while tuned to the currently active highest priority channel, store in the memory at least one new incoming audio transmission detected on a particular remaining channel out of the priority list of channels having a priority higher than the currently active highest priority channel.

15. The device according to claim 14, wherein the processor is configured to:
responsive to receiving a user input, switch to the particular remaining channel, and while continuing to store any subsequently received portions of the new incoming audio transmission in the memory, play back already recorded portions of the new incoming audio transmission from the memory.

16. The device according to claim 14, wherein the processor is configured to:
while tuned to the currently active highest priority channel, store a plurality of new incoming audio transmissions in the memory, each new incoming audio transmission detected on a corresponding particular one of the remaining channels having a priority higher than the currently active highest priority channel.

17. The device according to claim 10, wherein the processor is configured to:
log a last channel out of the list of channels on which a last incoming audio transmission was detected.

18. The device according to claim 17, wherein the processor is configured to:
responsive to a user input indicating an intent to transmit a response to the last incoming audio transmission, automatically tune to the logged last channel.

19. The method according to claim 1, wherein scanning by the communications device remaining channels from the priority list of channels having a priority higher than the currently active highest priority channel for new incoming audio transmission comprises:
continuously and sequentially scanning the remaining channels from highest priority to lowest priority.

20. The device according to claim 10, wherein the processor is configured to scan channels of a priority higher than the currently tuned highest priority channel for incoming audio transmissions by continuously and sequentially scanning the remaining channels from highest priority to lowest priority.

* * * * *